United States Patent
Itabashi et al.

(10) Patent No.: US 9,425,016 B2
(45) Date of Patent: Aug. 23, 2016

(54) ELECTRONIC PART AND ELECTRONIC CONTROL UNIT

(71) Applicants: DENSO CORPORATION, Kariya, Aichi-pref. (JP); Murata Manufacturing Co., Ltd., Nagaokakyo-shi, Kyoto-fu (JP)

(72) Inventors: Toru Itabashi, Anjo (JP); Yuki Mikami, Kariya (JP); Ryoichi Shiraishi, Okazaki (JP); Akihiro Yanagisawa, Toyohashi (JP); Shigeki Nishiyama, Nagaokakyo (JP)

(73) Assignees: DENSO CORPORATION, Kariya (JP); Murata Manufacturing Co., Ltd., Nagaokakyo-shi (JP)

(*) Notice: Subject to any disclaimer, the term of this patent is extended or adjusted under 35 U.S.C. 154(b) by 186 days.

(21) Appl. No.: 14/190,210

(22) Filed: Feb. 26, 2014

(65) Prior Publication Data
US 2014/0238732 A1  Aug. 28, 2014

(30) Foreign Application Priority Data
Feb. 28, 2013  (JP) .................. 2013-038359

(51) Int. Cl.
*H05K 1/16* (2006.01)
*H01H 85/02* (2006.01)
(Continued)

(52) U.S. Cl.
CPC ........... *H01H 85/0241* (2013.01); *H01H 85/10* (2013.01); *H05K 1/0263* (2013.01);
(Continued)

(58) Field of Classification Search
CPC .............. H01H 2085/0275; H01H 2085/285; H01H 85/0241; H01H 85/10; H05K 1/0263; H05K 1/181; H05K 2201/10181; H05K 2201/10946; H05K 3/3426

USPC ........ 361/15, 103, 104, 275.4, 628, 630, 642, 361/646, 738, 766, 783; 337/33, 157, 158, 337/159, 168

See application file for complete search history.

(56) References Cited

U.S. PATENT DOCUMENTS

| | | | | |
|---|---|---|---|---|
| 4,991,059 A | * | 2/1991 | Kiyose | H05K 3/3426 338/329 |
| 5,253,148 A | * | 10/1993 | Katsu | H01G 9/155 29/25.03 |

(Continued)

FOREIGN PATENT DOCUMENTS

| | | | |
|---|---|---|---|
| JP | 2006-024825 A | | 1/2006 |
| JP | 2006024825 | * | 1/2006 |
| JP | 2007-311467 A | | 11/2007 |

OTHER PUBLICATIONS

U.S. Appl. No. 14/190,249, filed Feb. 26, 2014, Mikami et al.
U.S. Appl. No. 14/190,250, filed Feb. 26, 2014, Shiraishi et al.
U.S. Appl. No. 14/190,297, filed Feb. 26, 2014, Kamiya et al.
(Continued)

*Primary Examiner* — Yuriy Semenenko
(74) *Attorney, Agent, or Firm* — Posz Law Group, PLC

(57) ABSTRACT

A main body of an electronic part has multiple electrodes, to which multiple terminals are respectively connected. The terminals include a normal terminal and a fuse terminal, each of which extends from lands formed in a printed board so as to hold the main body at a position above and separated from a board surface of the printed board. The fuse terminal has multiple leg portions divided by slits. A first leg portion forms an electrical path portion having a cut-off portion, a width of which is smaller than that of other portions of the electrical path portion. A second leg portion has a first supporting leg and a second supporting leg, which are arranged at both sides of the first leg portion. Each of the supporting legs is connected to each of dummy lands formed in the printed board.

6 Claims, 5 Drawing Sheets

(51) Int. Cl.
  *H05K 1/02* (2006.01)
  *H01H 85/10* (2006.01)
  *H05K 1/18* (2006.01)
  *H05K 3/34* (2006.01)
  *H01H 85/20* (2006.01)

(52) U.S. Cl.
  CPC ............... *H01H2085/0275* (2013.01); *H01H 2085/2085* (2013.01); *H05K 1/181* (2013.01); *H05K 3/3426* (2013.01); *H05K 2201/10181* (2013.01); *H05K 2201/10946* (2013.01)

(56) References Cited

U.S. PATENT DOCUMENTS

| 2011/0177387 | A1* | 7/2011 | Byun ............... H01M 2/04 429/178 |
| 2012/0200970 | A1 | 8/2012 | Itabashi et al. |
| 2013/0102205 | A1* | 4/2013 | Onoda ............... H01H 69/02 439/874 |

OTHER PUBLICATIONS

U.S. Appl. No. 14/190,280, filed Feb. 26, 2014, Murowaki et al.
U.S. Appl. No. 14/190,299, filed Feb. 26, 2014, Itabashi et al.

* cited by examiner

ELECTRONIC PART AND ELECTRONIC CONTROL UNIT

CROSS REFERENCE TO RELATED APPLICATION

This application is based on Japanese Patent Application No. 2013-038359 filed on Feb. 28, 2013, the disclosure of which is incorporated herein by reference.

FIELD OF TECHNOLOGY

The present disclosure relates to an electronic part mounted to a printed board and an electronic control unit having the electronic part.

BACKGROUND

A printed board having a pattern fuse, which is a part of wiring patterns formed in the printed board, is known in the art, for example, as disclosed in Japanese Patent Publication No. 2007-311467.

The pattern fuse is generally so formed as to be narrower than a remaining part of the wiring patterns. Therefore, for example, when a short-circuit occurs in an inside of an electronic device or an electronic part and thereby excess current flows, the pattern fuse is melted down due to heat generation in order that an electric pathway is cut off.

In a case of the pattern fuse, it is necessary to individually design the pattern fuses when the pattern fuses are used for different types of electronic parts or when the pattern fuses are used to the same type of the electronic part but ratings of the electronic parts are different from each other. As a result, it is difficult to commonalize or standardize the printed boards for different types of electronic control units. In other words, it is difficult to commonalize the printed boards and to simply change the electronic parts to be mounted to the printed board in order to use the same type of the printed board for the different types of the electronic control units (variation products).

In addition, it is difficult to make a size of the printed board as well as the electronic control unit smaller, because the pattern fuse (or pattern fuses) is formed in the printed board as a part of the wiring patterns.

In addition, the heat generated at the pattern fuse due to the excess current directly goes away to an insulating board of the printed board neighboring to the pattern fuse or the heat generated at the pattern fuse may indirectly go away to the insulating board via the wiring pattern connected to the pattern fuse. Since the heat of the pattern fuse goes away to the insulating board as above, it is a problem that it may take a longer time from short-circuit in the electronic part to melt-down of the pattern fuse. In other words, it is not possible to quickly cut off the pattern fuse with high response. In addition, since response characteristics vary, it is not possible to assure accuracy of performance for cutting off the pattern fuse.

SUMMARY OF THE DISCLOSURE

The present disclosure is made in view of the above problems. It is an object of the present disclosure to provide an electronic part and an electronic control unit having the electronic part, according to which it is possible to commonalize and/or standardize a printed board, to which the electronic parts are mounted, and to make a size of the printed board smaller. In addition, it is another object of the present disclosure to improve response of cutting-off performance between short-circuit of the electronic part and cut-off of excess current.

According to a feature of the present disclosure, an electronic part mounted to a printed board comprises:

a main body having multiple electrodes and arranged at a position above and separated from a board surface of the printed board; and multiple terminals respectively connected to the electrodes and extending from the main body toward the printed board so as to hold the main body at the position above and separated from the board surface in a condition that each of the terminals is electrically connected to each of corresponding lands formed in the printed board.

At least one of the terminals is composed of a fuse terminal, which forms an electrical path portion for electrically connecting the electrode to the land.

The fuse terminal comprises;

a cut-off portion having a width smaller than that of other portions of the fuse terminal, the cut-off portion being melted down depending on heat generated by excess current so as to cut off electrical connection between the electrode and the land;

an upper-side connecting portion for connecting the cut-off portion to an electrode-connected portion of the fuse terminal; and a lower-side large-width portion having a surface-mounted portion connected to the land and a lower-side connecting portion for connecting the cut-off portion to the surface-mounted portion, wherein the lower-side connecting portion extends from the surface-mounted portion toward the cut-off portion in a direction perpendicular to the board surface in order to hold the cut-off portion at the position above and separated from the board surface.

According to the above feature, the multiple terminals are provided in the electronic part and one of the terminals is composed of the fuse terminal having the cut-off portion. Therefore, it is possible to commonly use the printed boards for different types of electronic control units. In addition, since a pattern fuse is not provided in the printed board, it is possible to reduce a size of the printed board and thereby a size of the electronic control unit by such a volume corresponding to the pattern fuse, which can be eliminated in the present disclosure.

In addition, it is possible to hold the cut-off portion at the position above and separated from the board surface in the condition that the fuse terminal is connected to the land. Accordingly, the heat of the cut-off portion hardly goes away directly to the printed board. Furthermore, since the part of the lower-side large-width portion for supporting the cut-off portion is also located at the position above the board surface, the heat of the cut-off portion does not easily go away to the printed board via the lower-side large-width portion.

As a result, it is possible to shorten the time between the short-circuit in the electronic part and the melt-down at the cut-off portion, to thereby improve the response for cutting off the electrical connection between the electrode and the land. In addition, it is possible to decrease variation of the response performance and thereby to increase accuracy for cut-off performance.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present disclosure, since the heat of the cut-off portion is not easily transferred to the printed board, it is possible not only to improve the response but also to reduce the manufacturing cost. Furthermore, since the heat of the cut-off portion is not easily transferred to the printed board, it is possible to loosen up designing of heat-resisting performance for the printed board. The manufacturing cost is correspondingly further reduced.

In the printed board having the pattern fuses, heat generated at electronic parts neighboring to one pattern fuse and/or heat generated at other pattern fuses adjacent to the one pattern fuse is transferred to the one pattern fuse via an insulating board and wiring patterns. Since the pattern fuse is influenced by the heat generated at portions surrounding the pattern fuse, the pattern fuse may be melted down before the short-circuit fault occurs in the electronic part, in a case of a high-density packaging.

According to the present disclosure, since the cut-off portion is held at the position above and separated from the board surface, the cut-off portion is not easily influenced by the heat of the other electronic parts. It is, therefore, possible to realize the high-density packaging. In other words, the size of the printed board can be reduced and thereby the manufacturing cost can be correspondingly reduced.

According to another feature of the present disclosure, an electronic part mounted to a printed board comprises;

a main body having multiple electrodes and arranged at a position above and separated from a board surface of the printed board; and multiple terminals respectively connected to the electrodes and extending from the main body toward the printed board so as to hold the main body at the position above and separated from the board surface in a condition that each of the terminals is electrically connected to each of corresponding lands formed in the printed board.

At least one of the terminals is composed of a fuse terminal, which forms an electrical path portion for electrically connecting the electrode to the land.

The printed board has a dummy land in addition to the land.

The fuse terminal comprises;

an electrode-connected portion formed at one end of the fuse terminal and connected to the electrode;

a slit having a predetermined length and extending from the other end of the fuse terminal opposite to the electrode-connected portion in a direction to the electrode-connected portion, the other end of the fuse terminal being located on a side of the land; and multiple leg portions divided by the slit and formed at both sides of the slit, the leg portions being composed of a first leg portion and a second leg portion, the first leg portion forming the electrical path portion having a surface-mounted portion connected to the land.

The first leg portion for the electrical path portion comprises;

a cut-off portion having a width smaller than that of other portions of the electrical path portion, the cut-off portion being melted down depending on heat generated by excess current so as to cut off electrical connection between the electrode and the land; and an upper-side connecting portion for connecting the cut-off portion to the electrode-connected portion.

The second leg portion is connected to the dummy land and has a width larger than that of the cut-off portion for the entire length of the second leg portion, wherein the second leg portion works as a supporting leg for supporting the cut-off portion and the connecting portion in a direction perpendicular to the board surface of the printed board and at the position above and separated from the board surface.

According to the above feature, it is possible to stably support the main body at the position above and separated from the board surface by the second leg portion of the fuse terminal and the normal terminal, even in a case that the cut-off portion is melted down. Accordingly, it is possible to prevent re-connection between the electrode and the land.

Since the cut-off portion has the smaller width than the other portions of the fuse terminal, the cut-off portion is easily deformed when any external force is applied to it. However, according to the above feature of the present disclosure, the fuse terminal has the second leg portion in addition to the first leg portion of the electrical path portion. As a result, it is possible to prevent a possible deformation of the cut-off portion, which may be caused by contact with a jig when the fuse terminal is mounted to the printed board and/or during a transportation process after the product is completed. Accordingly, it is possible that the cut-off portion brings out its function for cutting off the electrical connection between the electrode and the land.

Furthermore, according to the above feature, the second leg portion is separately formed from the first leg portion of the electrical path portion by the slit. When compared the fuse terminal having the second leg portion with such a fuse terminal having no second leg portion, a width of the large-width portion of the fuse terminal having the second leg portion is smaller than that of the fuse terminal having no second leg portion, in a condition that a maximum width of the fuse terminal having the second leg portion is equal to that of the fuse terminal having no second leg portion. Therefore, it is possible to make smaller an amount of heat of the cut-off portion, which may go away to other portions of the electrical path portion. In addition, since a space is formed between the first leg portion for the electrical path portion and the second leg portion, the heat of the cut-off portion is hardly transmitted to the second leg portion. As above, it is possible to prevent the heat of the cut-off portion from going away to the other portions of the fuse terminal, and the response is thereby improved.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
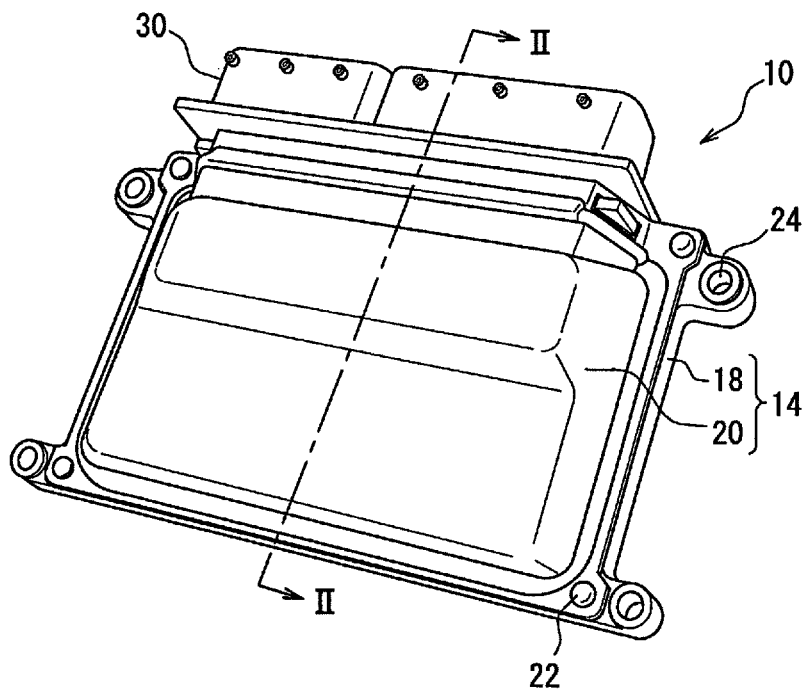
FIG. 1 is a perspective view schematically showing a structure of an electronic control unit according to a first embodiment of the present disclosure.

The present disclosure will be explained hereinafter by way of multiple embodiments. The same reference numerals are given to the same or similar portions and/or structures throughout the embodiments, for the purpose of eliminating repeated explanation.

(First Embodiment)

Figure 2:
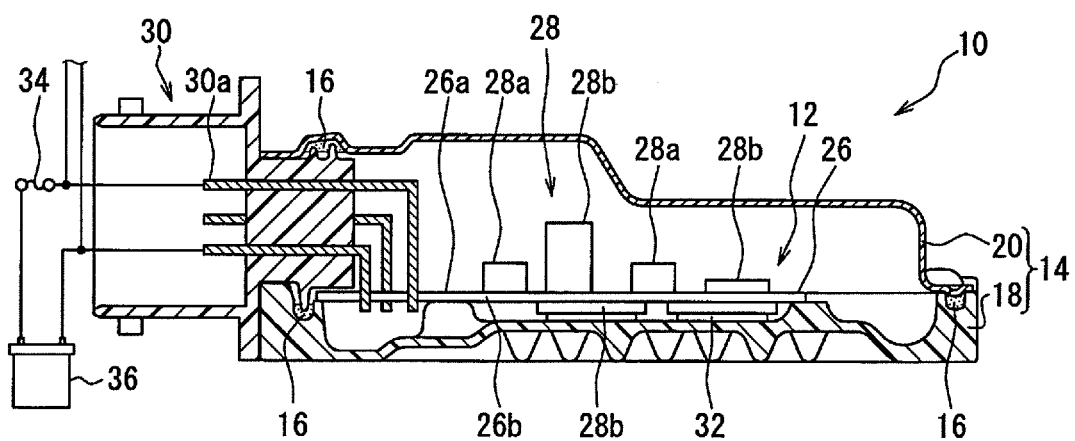
FIG. 2 is a schematic cross sectional view taken along a line II-II in FIG. 1.

An electronic control unit 10 shown in FIGS. 1 and 2 has a circuit board 12 as a main part thereof. The electronic control unit 10 further has a housing 14 for accommodating the circuit board 12 and a seal element 16. In the present embodiment, the electronic control unit 10 is formed as an electronic control unit (ECU) of a water-proof type for controlling an operation of an engine for a vehicle.

An outline structure for the electronic control unit 10 will be hereinafter explained.

The housing 14 is made of metal, such as, aluminum, iron or the like, or resin material, for accommodating therein the circuit board 12 so as to protect the same from water, dust and so on. A number of parts for forming the housing 14 is not limited to a specific number, so that the housing 14 may be composed of one or multiple members.

As shown in FIG. 2, according to the present embodiment, the housing 14 is composed of two parts, that is, a lower casing 18 of a shallow-box shape having an upper open end and an upper casing 20 for closing the upper open end of the lower casing 18. The upper casing 20 is fixed to the lower casing 18 by multiple screws 22 (or bolts) to form an inside space of the housing 14 for accommodating the circuit board 12. In an assembled condition of the housing 14, a portion (or multiple portions) of the circuit board 12 is directly or indirectly interposed between the lower and the upper casings 18 and 20, so that the circuit board 12 is firmly held at a predetermined position inside of the housing 14.

In the present embodiment, the housing 14 is divided into the lower and the upper casings 18 and 20 in a vertical direction (a thickness direction of the circuit board 12). However, a dividing direction for the parts (the lower casing 18 and the upper casing 20) of the housing 14 is not limited to the vertical direction.

Multiple through-holes 24 (four in the present embodiment) are formed at each corner of the lower casing 18 in order that screws or bolts (not shown) are respectively inserted into the through-holes 24 so as to fix the electronic control unit 10 to a predetermined position, for example, to an engine block. An aperture is formed in the housing 14 so that a portion of a connector 30 outwardly protrudes from the inside of the housing 14.

The seal element 16 has a function for preventing water from coming into the inside space of the housing 14. As shown in FIG. 2, the seal element 16 is arranged at a position, at which outer peripheries of the lower and the upper casings 18 and 20 are opposed to each other. The seal element 16 is also arranged at a position, at which the housing 14 and the connector 30 are opposed to each other.

The circuit board 12 is composed of a printed board 26, to which multiple electric or electronic parts and/or components 28 (hereinafter collectively referred to as the electronic parts 28), such as a micro-computer, power transistors, resistors, capacitors and the like are mounted to form electric circuits. The electronic parts 28 are mounted to at least one of board surfaces (a front-side board surface 26a and a back-side board surface 26b) of the printed board 26. In the present embodiment, as shown in FIG. 2, the electronic parts 28 are mounted to both of the board surfaces 26a and 26b of the printed board 26.

For example, multiple electronic parts 28a are mounted to the front-side board surface 26a of the printed board 26, wherein each of the electronic parts 28a has a fuse terminal 48a (FIG. 5), as explained below. The electronic parts 28a correspond to those electronic parts requiring the pattern fuse in a conventional device. The electronic parts other than the electronic parts 28a (having the fuse terminal 48a) are designated by 28b (having no fuse terminal) in the drawing, for the sake of convenience.

In addition to the electronic parts 28, the connector 30 is further mounted to the printed board 26 for electrically connecting the electric circuits formed in the circuit board 12 to outside devices (not shown). In FIG. 2, multiple pins 30a of the connector 30 are mounted to the printed board 26 by a through-hole mounting process. However, the pins 30a may be alternatively mounted to the printed board 26 by a surface-mounting process or a surface-mounting structure.

A reference numeral 32 in FIG. 2 designates heat radiation gel arranged between some of the electronic parts 28b and the lower casing 18 and being in contact with them, so as to transfer heat of the electronic parts 28b to the lower casing 18.

In the above-explained electronic control unit 10, an outside connector (not shown) is fitted to the connector 30 (the pins 30a of the connector 30), so that the electronic control unit 10 is electrically connected to a wire harness (not shown). The connector 30 is electrically connected to a battery 36 (a direct current power source) via a main fuse 34 for protecting the electronic control unit 10 from excess current. The battery 36 is also connected to other electronic control units (not shown), such as a brake control ECU, a steering control ECU, a body ECU, a navigation device and so on.

Since the main fuse 34 is provided in a path for supplying electric power necessary for operating the various kinds of the electronic devices, including the electronic control unit 10, a large-size fuse (for example, a fuse element for 15A, 20A or the like) is used for the main fuse 34. The main fuse 34 is melted down by the excess current larger than a predetermined value, when any defect or trouble occurs in any one of the electronic devices (including the electronic control unit 10) and thereby the excess current flows through the main fuse 34. Then, the power supply via the main fuse 34 is cut off to prevent an adverse effect to the other electronic devices.

Figure 3:
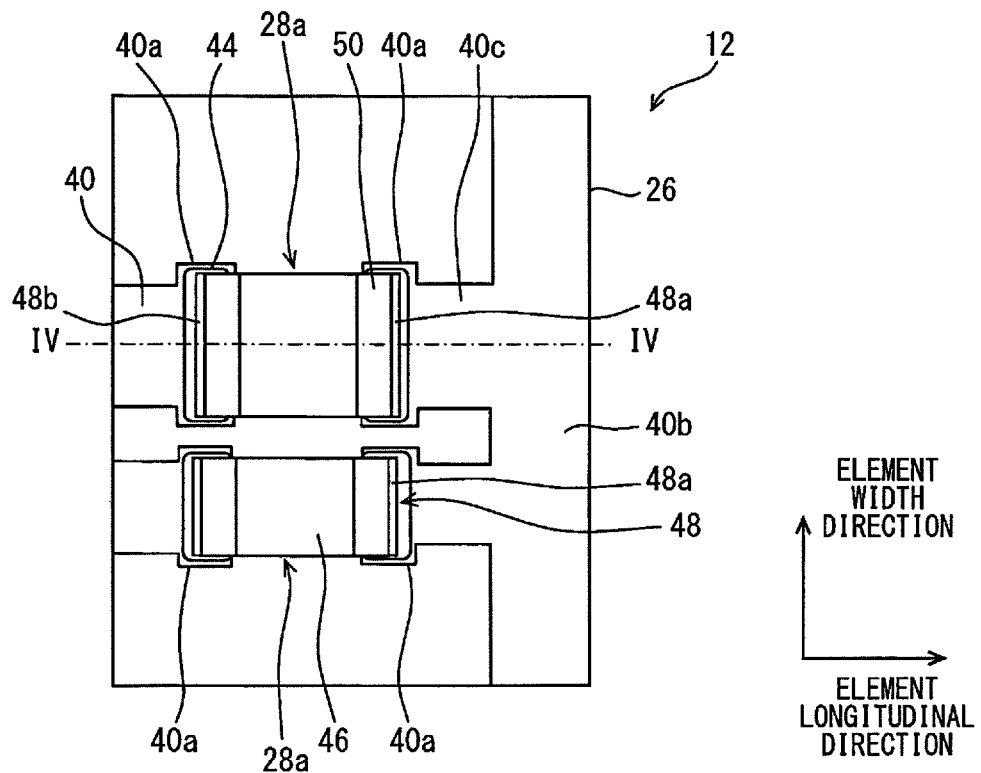
FIG. 3 is a schematically enlarged top plan view showing a portion of a printed board (an electronic part mounted to the printed board)
Figure 4:
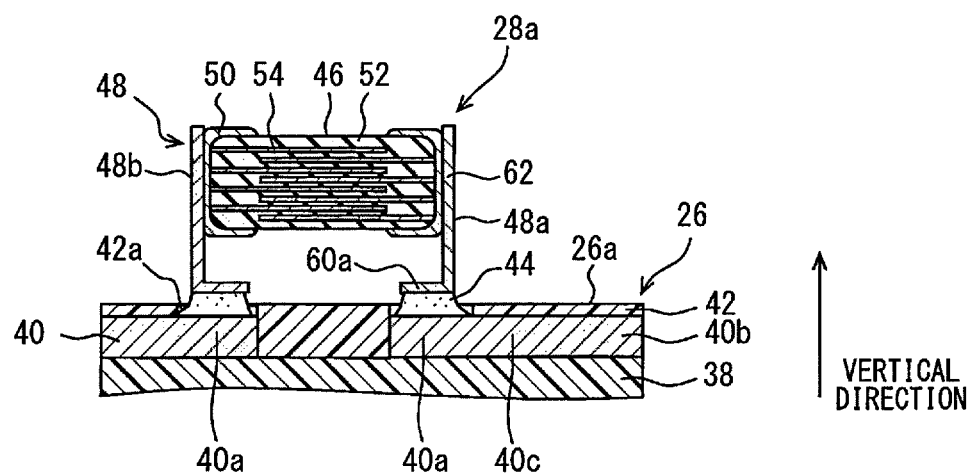
FIG. 4 is a schematic cross sectional view taken along a line IV-IV in FIG. 3.

The circuit board 12, in particular, the electronic part 28a, will be explained more in detail with reference to FIGS. 3 to 6. FIGS. 3 and 4 show relevant portions of the circuit board 12, including one of the electronic parts 28a and portions of the circuit board 12 neighboring to the electronic part 28a mounted to the printed board 26. In FIG. 3, a resist 42 (shown in FIG. 4) is eliminated for the sake of convenience.

The printed board 26 is composed of an insulating board 38 made of resin or ceramics as its main material, and wiring patterns 40 made of conducting material (such as cupper) and arranged on the insulating board 38. Although not shown in the drawing, in the present embodiment, the wiring patterns 40 are formed in a multi-layer structure on the insulating board 38 and the wiring patterns 40 are formed at both board surfaces of the insulating board 38.

The resist 42 is arranged on the board surface of the insulating board 38 (corresponding to the front-side board surface 26a of the printed board 26) so as to cover the wiring patterns 40. The resist 42 has openings 42a at predetermined positions. A portion of the wiring patterns 40, which is exposed to an outside of the printed board 26 via each of the openings 42a, forms a land 40a connected to the electronic part 28a via solder 44.

A resist (42: not shown) is also arranged on the board surface of the insulating board 38 corresponding to the back-side board surface 26b of the printed board 26, so that lands (40a: not shown) are exposed to the outside through respective openings (42a: not shown).

Figure 5:
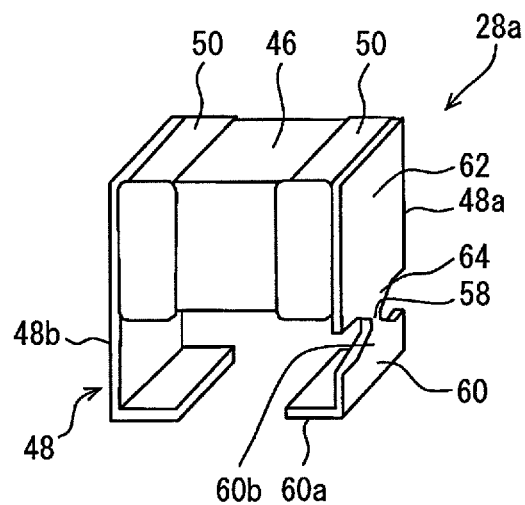
FIG. 5 is a perspective view schematically showing a structure of the electronic part.

As shown in FIGS. 3 to 5, the electronic part 28a has an electronic-element main body 46 and multiple terminals 48. The electronic-element main body 46 (hereinafter, the main body 46) has at least one electric element (a capacitor as explained below) and multiple electrodes 50 electrically connected to the electronic element and arranged at outer surfaces of the main body 46. The main body 46 is arranged above the front-side board surface 26a of the printed board 26. In the present embodiment, the circuit board 12 has multiple electronic parts 28a, one of which is a ceramic-type laminated capacitor shown in FIG. 4. As shown in FIG. 4, the main body 46 of the electronic part 28a (the ceramic-type laminated capacitor) has dielectric layers 52 made of high-dielectric ceramics of a barium-titanate type and electric conductor layers 54, wherein the dielectric layers 52 and the electric conductor layers 54 are alternately laminated in the vertical direction. The electrodes 50 are respectively connected to the electric conductor layers 54.

In other words, the electric conductor layers 54 correspond to inside electrodes, while the electrodes 50 correspond to outside electrodes. Each of the electronic parts 28a has multiple electrodes 50. As shown in FIGS. 3 and 4, an outer shape of the main body 46 of the electronic part 28a is formed in a rectangular shape on a plane, which is in parallel to the front-side board surface 26a of the printed board 26. The electrodes 50 are formed at both longitudinal ends of the main body 46 in an element longitudinal direction (in a horizontal direction in FIG. 3 or 4). Each of the electrodes 50 is formed at the outer surfaces of the main body 46, that is, a lower-side surface facing to the front-side board surface 26a of the printed board 26, an upper-side surface opposite to the lower-side surface and a longitudinal side surface at the longitudinal end. Each of the electrodes 50 is connected to the respective terminals 48 via solder (not shown). The solder for connecting the electrode 50 to the terminal 48 has a higher melting point than the solder 44 for connecting the terminal 48 to the land 40a, so that the solder at the electrodes 50 is not melted down in a reflow soldering process.

Figure 6:
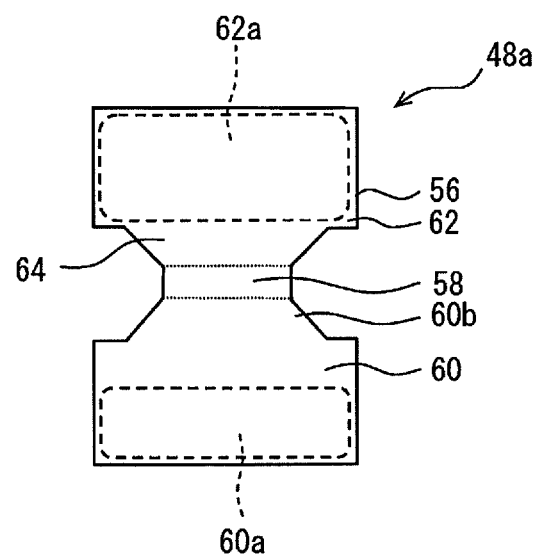
FIG. 6 is a development view schematically showing a structure of a fuse terminal.

Each of the terminals 48 is electrically connected to the respective electrodes 50 of the electronic part 28a. More exactly, each of the terminals 48 is connected to the corresponding electrode 50 formed at the longitudinal side surface of the main body 46. Each of the terminals 48 extends from the main body 46 in the vertical direction (in a downward direction toward the printed board 26), so that the multiple terminals 48 support the main body 46 above the front-side board surface 26a (at a position above and separated from the front-side board surface 26a) in a condition that each of the terminals 48 is electrically connected to the respective lands 40a of the printed board 26. In the present embodiment, as shown in FIGS. 4 to 6, a metal plate having a constant thickness is punched out in a predetermined shape and one part of such punched-out metal plate is bent in a thickness direction of the metal plate, so that the terminal 48 is formed in an L-letter shape.

At least one of the terminals 48 is formed as the fuse terminal 48a. In other words, one of the terminals 48, which are respectively connected to the different lands 40a, is formed as the fuse terminal 48a. The terminals 48 other than the fuse terminals 48a are referred to as normal terminals 48b. In the present embodiment, one terminal 48 is connected to one electrode 50. In other words, only one fuse terminal 48a is connected to one of the electrodes 50, while only one normal terminal 48b is connected to the other of the electrodes 50.

The fuse terminal 48a has an electrical path portion 56 for electrically connecting the land 40a to the electrode 50. In the present embodiment, the whole area of the fuse terminal 48a forms the electrical path portion 56. As shown in FIG. 6, the electrical path portion 56 of the fuse terminal 48a has an upper-side large-width portion 62, an upper-side connecting portion 64, a cut-off portion 58, a tapered portion 60b and a lower-side large-width portion 60.

The cut-off portion 58 has a width smaller than that of other portions of the fuse terminal 48a, so that the cut-off portion 58 is melted down by heat generation caused by excess current. The electrical connection between the electrode 50 and the land 40a is thereby cut off. The width of the cut-off portion 58 corresponds to a dimension in an element-width direction, which is perpendicular to both of a direction of current flow in the fuse terminal 48a and a thickness direction of the fuse terminal 48a. Therefore, the element-width direction corresponds to a direction, which is parallel to the board surface 26a of the printed board 26 and perpendicular to the element-longitudinal direction. Furthermore, the element-width direction corresponds to an up-and-down direction in FIG. 3 and a horizontal direction in FIG. 6. The cut-off portion 58 is held at the position above and separated from the board surface 26a of the printed board 26, when the fuse terminal 48a is soldered to the land 40a.

The lower-side large-width portion 60 corresponds to a portion of the fuse terminal 48a (the electrical path portion 56) between the cut-off portion 58 and one end of the fuse terminal 48a on a side to the land 40a. The lower-side large-width portion 60 includes a surface-mounted portion 60a (which is also referred to as a land-connected portion 60a) soldered to the land 40a. At least a part of the lower-side large-width portion 60 (except for the surface-mounted portion 60a) extends in the vertical direction and is located above the board surface 26a, in order to support the cut-off portion 58 at the position above and separated from the board surface 26a, in a condition that the fuse terminal 48a is connected to the land 40a. The part of the lower-side large-width portion 60, except for the surface-mounted portion 60a, is also referred to as a vertical supporting portion.

As shown in FIG. 6, according to the present embodiment, the fuse terminal 48a has the tapered portion 60b, a width of which is increased in a direction from the cut-off portion 58 toward the lower-side large-width portion 60. The lower-side large-width portion 60 formed in a rectangular shape extending from vertical supporting portion to the surface-mounted portion 60a, wherein the width of the rectangular shape is larger than a maximum width of the tapered portion 60b. A part (the surface-mounted portion 60a) of the rectangular shape is bent by an angle of 90 degrees with respect to a remaining part (the vertical supporting portion) of the rectangular shape, so as to form the surface-mounted portion 60a at the end of the fuse terminal 48a. The width of the rectangular shape has a maximum width for the fuse terminal 48a.

The tapered portion 60b and the vertical supporting portion (the portion of the lower-side large-width portion 60 except for the surface-mounted portion 60a) are collectively referred to as a lower-side connecting portion (60, 60b).

In addition, the upper-side large-width portion 62 of the fuse terminal 48a has an electrode-connected portion 62a connected to the electrode 50 of the main body 46 via solder.

The fuse terminal 48a further has the upper-side connecting portion 64 formed between the cut-off portion 58 and the electrode-connected portion 62a and connecting them to each other. In the present embodiment, the upper-side connecting portion 64 is formed in a tapered shape, a width of which is increased in a direction from the cut-off portion 58 toward the electrode-connected portion 62a. The upper-side large-width portion 62 for the electrode-connected portion 62a is formed in a rectangular shape having a width larger than a maximum width of the tapered-shape portion of the upper-side connecting portion 64. The width of the rectangular shape of the upper-side large-width portion 62 is equal to that of the lower-side large-width portion 60 for the surface-mounted portion 60a.

The lower part of the fuse terminal 48a bent in the L-letter shape, which is in parallel to the front-side board surface 26a, forms the surface-mounted portion 60a to be connected to the land 40a. A remaining part of the fuse terminal 48a perpendicular to the front-side board surface 26a is composed of the vertical supporting portion of the lower-side large-width portion 60 (except for the surface-mounted portion 60a), the tapered portion 60b, the cut-off portion 58, the upper-side connecting portion 64 and the upper-side large-width portion 62 (including the electrode-connected portion 62a). Namely, the portion of the fuse terminal 48a connecting the surface-mounted portion 60a to the electrode-connected portion 62a extends in the same plane to that of the electrode-connected portion 62a, that is, in the vertical direction perpendicular to the front-side board surface 26a.

A cross-sectional area of the normal terminal 48b is made to be larger than that of the cut-off portion 58 of the fuse terminal 48a for the entire length of the normal terminal 48b. In the present embodiment, a metal plate of a rectangular shape having a constant thickness is bent by a predetermined angle (for example, 90 degrees) toward a thickness direction thereof, so that the normal terminal 48b is formed in the L-letter shape, as shown in FIG. 5. The normal terminal 48b does not have a structure corresponding to the cut-off portion 58 of the fuse terminal 48a. In the present embodiment, the thickness of the normal terminal 48b is equal to that of the fuse terminal 48a, while the width of the normal terminal 48b is equal to that of the lower-side large-width portion 60 or the upper-side large-width portion 62 of the fuse terminal 48a.

As shown in FIG. 3, the fuse terminal 48a of the electronic part 28a is electrically connected to a power-source wiring pattern 40b via the land 40a and a connecting wiring pattern 40c. The power-source wiring pattern 40b corresponds to a part of the wiring patterns 40, which is commonly used for multiple electronic parts 28 (including the electronic part 28a). The power-source wiring pattern 40b is electrically connected to the battery 36 via the pin 30a of the connector 30.

Advantages of the electronic part 28a and the electronic control unit 10 of the present embodiment will be explained.

In the present embodiment, the electrodes 50 of the electronic part 28a are not directly connected to the lands 40a of the printed board 26 via the solders 44. Instead, the multiple terminals 48 are provided between the electrodes 50 and the lands 40a so that the electrodes 50 are indirectly connected to the lands 40a via the respective terminals 48. In addition, one of the terminals 48 for the electronic part 28a is composed of the fuse terminal 48a having the cut-off portion 58. Accordingly, when short-circuit occurs in the electronic part 28a and thereby the excess current (short-circuit current) flows, the heat is generated depending on the excess current at the cut-off portion 58 having the smaller width (namely, having the smaller cross sectional area). And when temperature at the cut-off portion 58 becomes higher than a predetermined value, the cut-off portion 58 is melted down and the electrical connection between the electrode 50 and the land 40a is cut off. Accordingly, it is possible to quickly cut off the electrical connection between the electrode 50 and the land 40a (which are connected to each other by the fuse terminal 48a before the melt-down) when the excess current flows through the fuse terminal 48a.

As above, the function for cutting off the excess current (the short-circuit current) caused by the short-circuit fault of the electronic part 28a is realized not by a pattern fuse formed in the printed board 26 but by the fuse terminal 48a for the electronic part 28a. As a result, it becomes possible to commonalize and/or standardize the printed boards 26, which can be commonly used for the different types of the electronic control units. Therefore, it is possible to provide variation products, for which the same printed boards 26 can be used but different electronic parts 28a are mounted to the printed board 26.

In addition, it is possible to make the size of the printed board 26 as well as the electronic control unit 10 smaller by such a volume corresponding to the pattern fuse, which is not necessary in the present embodiment.

The cut-off portion 58 is located at the position above and separated from the board surface 26a of the printed board 26, in the condition that the fuse terminal 48a is connected to the land 40a. Therefore, the heat of the cut-off portion 58 hardly goes away directly to the printed board 26. In addition, since the part of the lower-side large-width portion 60 (that is, the vertical supporting portion) supporting the cut-off portion 58 is also located above the board surface 26a, the heat of the cut-off portion 58 cannot easily go away to the printed board 26. Accordingly, it is possible to shorten the time between the short-circuit of the electronic part 28a and the melt-down of the cut-off portion 58 and to thereby improve response. Furthermore, since it is possible to reduce variation of response performance, it is possible to increase accuracy of cut-off performance.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present embodiment, since the heat of the cut-off portion 58 is not easily transferred to the printed board 26, it is possible not only to improve the response but also to reduce the manufacturing cost. Furthermore, since the heat of the cut-off portion 58 is not easily transferred to the printed board 26, it is possible to loosen up designing of heat-resisting performance for the printed board 26. The manufacturing cost is correspondingly further reduced.

In the printed board having the pattern fuses, heat generated at electronic parts neighboring to one pattern fuse and/or heat generated at other pattern fuses adjacent to the one pattern fuse is transferred to the one pattern fuse via the insulating board and the wiring patterns. Since the pattern fuse is influenced by the heat generated at portions surrounding the pattern fuse, the pattern fuse may be melted down before the short-circuit fault occurs in the electronic part, in a case of a high-density packaging.

According to the present embodiment, however, since the cut-off portion 58 is held at the position above and separated from the board surface of the printed board 26, the cut-off portion 58 is not easily influenced by the heat of the other electronic parts 28. It is, therefore, possible to realize the high-density packaging. In other words, the size of the printed board 26 can be reduced and thereby the manufacturing cost can be correspondingly reduced.

In the electronic control unit 10, at least some of the multiple electronic parts 28a having the fuse terminals 48a are connected to the power-source wiring pattern 40b via the lands 40a and the connecting wiring patterns 40c. As already explained above, when the short-circuit fault occurs in one of the electronic parts 28a and the excess current flows in the fuse terminal 48a, the connection between the electrode 50 and the land 40a is immediately cut off by the melt-down of the cut-off portion 58 of the fuse terminal 48a (which has connected the electrode 50 and the land 40a before the meltdown). Accordingly, it is possible to protect the other electronic parts 28 connected to the power-source wiring pattern 40b from the excess current.

The excess current flowing in the fuse terminal 48a for cutting off the cut-off portion 58 is not so large as the excess current for cutting off the main fuse 34. Therefore, it is possible to suppress adverse influence, which may be caused by the excess current flowing in the fuse terminal 48a, to power-supply to the other electronic devices.

In the present embodiment, the electronic part 28a includes the ceramic-type laminated capacitor. In a case that the electronic part 28a of the laminated structure is used, the size of the electronic part 28a can be made smaller and the high-density packaging for the printed board 26 can be realized. However, on the other hand, the electronic part having the laminated structure may have a problem that the electric conductor layers 54 (which are laminated in multiple layers) are likely to be short-circuited by vehicle vibration and/or heat stress. In the present embodiment having the electronic part 28a of the laminated structure, however, it is possible to rapidly cut off the electrical connection between the electrode 50 and the land 40a, if the short-circuit fault occurs.

The battery of a lithium system is more advantageous than a lead battery in view of power supplying capability. On the other hand, the lithium battery has such a disadvantage that it will be quickly deteriorated when current larger than a rated output current is supplied to electric loads. According to the present embodiment, however, the electrical connection between the electrode 50 and the land 40a is immediately cut off by the fuse terminal 48a in the case of short-circuit in the electronic part 28a. It is, therefore, possible to suppress adverse influence to the battery to a minimum value.

(Second Embodiment)

A second embodiment of the present disclosure will be explained with reference to FIGS. 7 and 8. Explanation for those portions, which are similar to or the same to those of the first embodiment (including the electronic part 28a, the electronic control unit 10 and so on), will be omitted.

Figure 7:
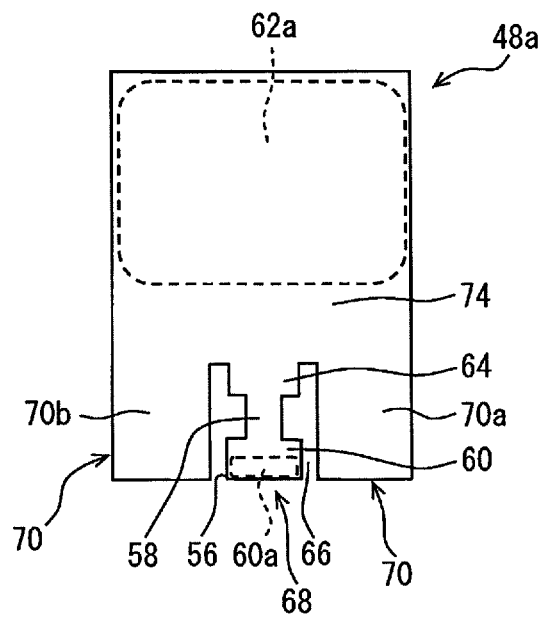
FIG. 7 is a development view schematically showing a structure of a fuse terminal according to a second embodiment.

As shown in FIG. 7, the fuse terminal 48a has multiple slits 66 extending in a direction from a lower end thereof on the side of the surface-mounted portion 60a toward the electrode-connected portion 62a, wherein each of the slits 66 has a predetermined length. Multiple leg portions 68 and 70 of a forked shape are formed by the slits 66.

In the present embodiment shown in FIG. 7, the fuse terminal 48a has two slits 66 and three leg portions 68 and 70. One of the leg portions (a first leg portion 68) located at a center forms the electrical path portion 56. The other two leg portions 70 at both sides of the electrical path portion 56 (the first leg portion 68) form second leg portions 70.

Figure 8:
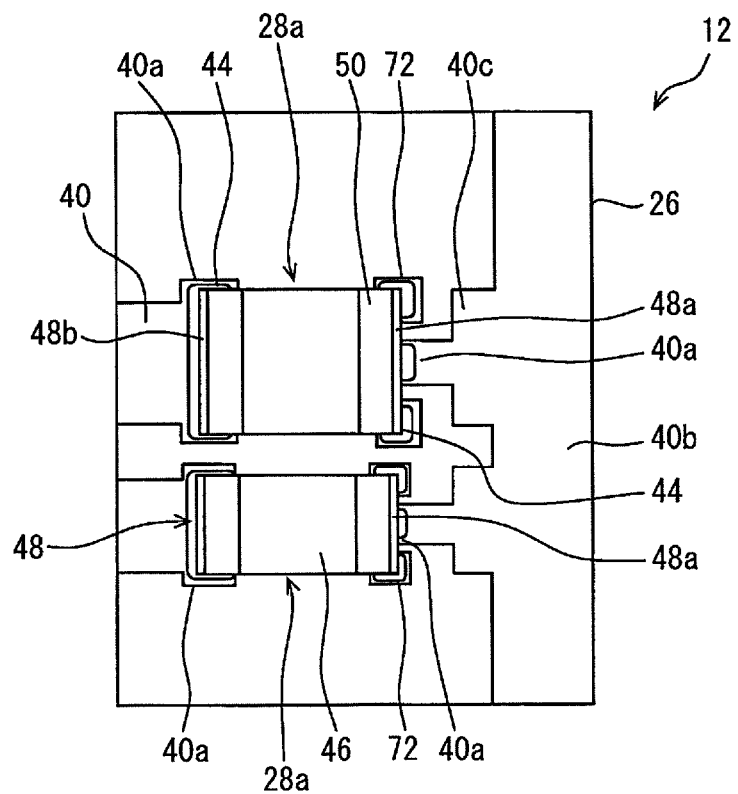
FIG. 8 is a schematically enlarged top plan view showing a portion of a printed board of the second embodiment.

As shown in FIG. 8, dummy lands 72 are formed in the printed board 26. Each of the lands 40a is a part of the wiring patterns 40 and has a function for electrical connection. Therefore, the land 40a forms a part of the electric circuits of the circuit board 12. On the other hand, in the present embodiment, the dummy land 72 does not have the function for the electrical connection and does not form the part of the electric circuits. The dummy lands 72 are, therefore, formed in the printed board 26 as independent parts from other electrical portions. The dummy land 72 is made of the same material for the land 40a and exposed to the outside of the printed board 26 through the opening (42a: not shown) of the resist (42: not shown) like the land 40a.

The second leg portions 70 are composed of a first supporting leg 70a and a second supporting leg 70b in order to increase the function of the terminals 48 for holding the main body 46 at the position above and separated from the board surface of the printed board 26. Each of the first and second supporting legs 70a and 70b is connected to each of corresponding dummy lands 72 by solder (not shown). Each of the first and second supporting legs 70a and 70b has a width larger than that of the cut-off portion 58 for its entire length. Each of the first and second supporting legs 70a and 70b is identical to each other and has the constant width. A lower end of each supporting leg 70a, 70b is bent by a predetermined angle toward the same direction to that of the surface-mounted portion 60a of the first leg portion 68. Each of the bent portions of the supporting legs 70a and 70b corresponds to a part of the supporting legs soldered to the respective dummy lands 72. Each of remaining parts of the supporting legs 70a and 70b other than the bent portion is located at the both sides of the cut-off portion 58. The first leg portion 68 and the second leg portions 70 (the first and second supporting legs 70a and 70b) are arranged on the same plane among one another.

A reference numeral 74 in FIG. 7 designates a base portion of the fuse terminal 48a, which is formed at an upper side of the leg portions 68 and 70 (70a, 70b). A part of the base portion 74 is formed as the electrode-connected portion 62a connected to the electrode 50. The base portion 74 also forms a part of the electrical path portion, together with the cut-off portion 58, the lower-side large-width portion 60 and the upper-side connecting portion 64. The lower-side large-width portion 60 and the upper-side connecting portion 64 are formed in the same shape to each other and each of the lower-side large-width portion 60 and the upper-side connecting portion 64 has a constant width in the vertical direction. The width of each second leg portion 70 (the first and second supporting legs 70a and 70b) is larger than that of the lower-side large-width portion 60 or the upper-side connecting portion 64.

Advantages of the electronic part 28a and the electronic control unit 10 of the second embodiment will be explained. The second embodiment has the following advantages in addition to those advantages of the first embodiment.

In the present embodiment, it is possible to more stably support the main body 46 at the position above the board surface 26a of the printed board 26 not only by the normal terminal 48b but also the second leg portions 70 (the first and second supporting legs 70a and 70b) of the fuse terminal 48a, even after the cut-off portion 58 is melted down. It is, therefore, possible to prevent re-connection between the electrode 50 and the land 40a.

The cut-off portion 58 has the width smaller than that of the other portions of the fuse terminal 48a. Therefore, when external force is applied to the cut-off portion 58, the cut-off portion is easily deformed. However, according to the present embodiment, the second leg portions 70 (the first and second supporting legs 70a and 70b) are provided in addition to the electrical path portion 56 having the cut-off portion 58 in the first leg portion 68. It is, therefore, possible to prevent the cut-off portion 58 from being deformed, which is possibly caused by a contact with a jig or the like when the electronic part 28*a* is mounted to the printed board 26 and/or during a transportation stage after the electronic part 28*a* is mounted to the printed board 26. Accordingly, the cut-off portion 58 can stably perform a cut-off operation in the condition that the electronic part 28*a* is mounted to the printed board 26.

In the present embodiment, the first leg portion 68 forming the electrical path portion 56 is spatially separated from the second leg portions 70 (the first and second supporting legs 70*a* and 70*b*) by the slits 66. When compared the present embodiment with the fuse terminal having no supporting leg, the width of the large-width portion 60 and the connecting portion 64 of the present embodiment is smaller than that of the fuse terminal having no supporting leg, in a condition that a maximum width of the fuse terminal 48*a* of the present embodiment is equal to that of the fuse terminal having no supporting leg. Therefore, in the present embodiment, the heat of the cut-off portion 58 is more hardly transferred to other portions of the fuse terminal 48*a*. Since a clearance (or a space) is formed between the first leg portion 68 (for the electrical path portion 56) and the second leg portions 70 (the first and second supporting legs 70*a* and 70*b*), the heat of the cut-off portion 58 is hardly transmitted to the second leg portions 70. As above, it is possible to prevent the heat of the cut-off portion 58 from going away to the other portions of the fuse terminal 48*a*. The response is thereby improved.

The first and the second supporting legs 70*a* and 70*b* are arranged at both sides of the first leg portion 68 for the electrical path portion 56 and the first and the second supporting legs 70*a* and 70*b* are arranged on the same plane to that of the first leg portion 68. According to the above structure, the main body 46 can be stably held at the position above the board surface by the normal terminal 48*b* and the first and the second supporting legs 70*a* and 70*b*, when the cut-off portion 58 is melted down. In addition, since the first and the second supporting legs 70*a* and 70*b* are provided at the both sides of the first leg portion 68 (for the electrical path portion 56), it is possible to more effectively prevent the cut-off portion 58 from being deformed and/or damaged by the possible contact with the jig during an assembling process.

In the present embodiment, the dummy lands 72 are provided. It is possible to check whether the short-circuit occurs in the electronic part 28*a* and/or whether the cut-off portion 58 is melted down, when probes of an inspection device are touched to the dummy land 72 for the fuse terminal 48*a* and the land 40*a* connected to the normal terminal 48*b*.

It is furthermore possible to form the dummy lands 72 as a part of the electric circuits of the circuit board 12 in order to monitor the possible melt-down of the cut-off portion 58. In such a case, the land 40*a* corresponds to a land for operating the electronic part 28*a*, while the dummy land 72 corresponds to a land for monitoring the melt-down condition of the cut-off portion 58.

(Modification)

In the above second embodiment, the second leg portions 70 are composed of two supporting legs, and the first and the second supporting legs 70*a* and 70*b* are provided at the both sides of the first leg portion 68 of the electrical path portion 56. However, a number of the supporting legs of the second leg portion 70 should not be limited to two. In addition, the layout of the supporting legs should not be limited to that of the above embodiment.

Figure 9:
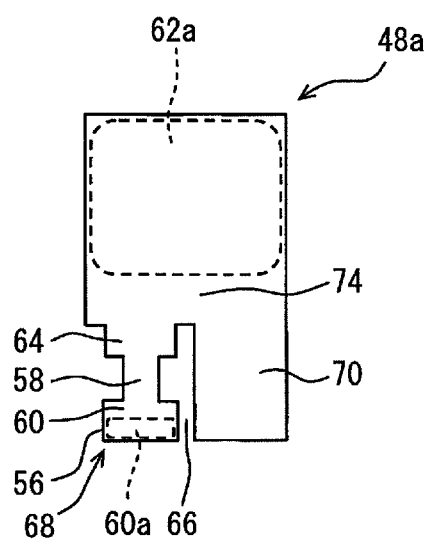
FIG. 9 is a development view schematically showing a structure of a fuse terminal according to a modification of the second embodiment.

For example, the fuse terminal 48*a* of the second embodiment can be modified as shown in FIG. 9, wherein the fuse terminal 48*a* has one slit 66 and two leg portions 68 and 70. Namely, the second leg portion 70 of the fuse terminal 48*a* has one supporting leg.

Alternatively, the second leg portion of the fuse terminal may have two supporting legs, wherein the two supporting legs are arranged to be neighboring to each other. Furthermore, the fuse terminal 48*a* may have four or more than four supporting legs.

The present disclosure should not be limited to the above embodiments and/or modifications but can be further modified in various manners without departing from the spirits of the present disclosure.

In the above embodiments, only one of the multiple terminals 48 is composed of the fuse terminal 48*a*. However, a number of the fuse terminals 48*a* for one electronic part 28*a* should not be limited to one. For example, the fuse terminals are applied to all of the terminals for one electronic part 28*a*.

In the above embodiments, one terminal 48 is connected to one electrode 50. However, a number of the terminal 48 to be connected to one electrode 50 should not be limited to one. For example, multiple fuse terminals 48*a* may be connected to one electrode 50. Alternatively, multiple normal terminals 48*b* may be connected to one electrode 50.

In the above embodiments, the fuse terminal 48*a* has one cut-off portion 58. A number of the cut-off portion should not be limited to one. The fuse terminal 48*a* may have multiple cut-off portions 58. For example, the fuse terminal 48*a* of FIG. 7 may be so modified that the first leg portion 68 is designed as the supporting leg to be connected to the dummy land 72, while each of the first and the second supporting legs 70*a* and 70*b* may be formed as the electrical path portions 56 having the cut-off portion 58.

In the above embodiments (for example, in the first embodiment), the ceramic-type laminated capacitor is explained as the example for the electronic part 28*a*. However, the above structures for the electronic part may be applied to any other types of the electronic elements. For example, a laminated inductor may be used as the electronic element having the laminated structure. In addition, the above structure may be applied not only to the electronic part of the laminated structure but also to any other types of electronic parts, such as, a diode, a transistor, a resistor and so on. An electronic part having more than two electrodes may be used.

In the above embodiments, at least one of the terminals 48 for electrically connecting the different lands 40*a* with each other is composed of the fuse terminal 48*a*. Ina case of an IGBT (Insulated Gate Bipolar Transistor), one of the terminals to be connected to an emitter electrode or a collector electrode is composed of the fuse terminal. Alternatively, the fuse terminal may be connected to a gate electrode.

In the above embodiments, the terminals 48 (including the fuse terminal 48*a*) are connected to the printed board 26 by the surface mounting technology. The terminals 48 may be alternatively connected to the printed board 26 by a through-hole mounting technology.

In the above embodiments, the electronic part 28*a* having the fuse terminal 48*a* is electrically connected to the power-source wiring pattern 40*b* (connected to the battery 36) via the land 40*a* and the connecting wiring pattern 40*c*. However, the electronic part 28*a* having the fuse terminal 48*a* may be electrically connected to other wiring patterns than the power-source wiring pattern.

What is claimed is:

1. An electronic part mounted to a printed board comprising:
   a main body having multiple electrodes and arranged at a position above and separated from a board surface of the printed board; and
   multiple terminals respectively connected to the electrodes and extending from the main body toward the printed board so as to hold the main body at the position above and separated from the board surface in a condition that each of the terminals is electrically connected to each of corresponding lands formed in the printed board, wherein at least one of the terminals is composed of a fuse terminal, which forms an electrical path portion for electrically connecting the electrode to the land, wherein the printed board has a dummy land in addition to the land, wherein the fuse terminal comprises:
- an electrode-connected portion formed at one end of the fuse terminal and connected to the electrode;
- a slit having a predetermined length and extending from the other end of the fuse terminal opposite to the electrode-connected portion in a direction to the electrode-connected portion, the other end of the fuse terminal being located on a side of the land; and
- multiple leg portions divided by the slit and formed at both sides of the slit, the leg portions being composed of a first leg portion and a second leg portion, the first leg portion forming the electrical path portion having a surface-mounted portion connected to the land, wherein the first leg portion for the electrical path portion comprises:
- a cut-off portion having a width smaller than that of other portions of the electrical path portion, the cut-off portion being melted down depending on heat generated by excess current so as to cut off electrical connection between the electrode and the land; and
- an upper-side connecting portion for connecting the cut-off portion to the electrode-connected portion, and wherein the second leg portion is connected to the dummy land and has a width larger than that of the cut-off portion for the entire length of the second leg portion, the second leg portion working as a supporting leg for supporting the cut-off portion and the connecting portion in a direction perpendicular to the board surface of the printed board and at the position above and separated from the board surface.

2. The electronic part according to claim 1, wherein the second leg portion is composed of two supporting legs, which are arranged at both sides of the first leg portion for the electrical path portion.

3. The electronic part according to claim 1, wherein the main body includes dielectric layers and electric conductor layers, which are alternately laminated.

4. An electronic control unit comprising:
the electronic part according to claim 1; and
the printed board having the lands connected to the terminals of the electronic part.

5. The electronic control unit according to claim 4, wherein the electronic part is electrically connected to a power-source wiring pattern formed on the printed board via the land.

6. The electronic control unit according to claim 5, wherein the power-source wiring pattern is connected to a battery installed in a vehicle.

\* \* \* \* \*